(12) United States Patent
Xiao

(10) Patent No.: US 10,148,316 B2
(45) Date of Patent: Dec. 4, 2018

(54) TECHNOLOGIES FOR PCB AND CABLE LOSS CHARACTERIZATION AND FIXTURE DE-EMBEDDING

(71) Applicant: Intel Corporation, Santa Clara, CA (US)

(72) Inventor: Kai Xiao, University Place, WA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 15/421,192

(22) Filed: Jan. 31, 2017

(65) Prior Publication Data

US 2017/0310404 A1 Oct. 26, 2017

Related U.S. Application Data

(60) Provisional application No. 62/327,671, filed on Apr. 26, 2016.

(51) Int. Cl.
*H04B 3/48* (2015.01)
*H04B 17/10* (2015.01)
*H04B 17/15* (2015.01)
*H04B 3/46* (2015.01)
*G01R 35/00* (2006.01)

(52) U.S. Cl.
CPC .............. *H04B 3/48* (2013.01); *G01R 35/005* (2013.01); *H04B 3/46* (2013.01); *H04B 17/102* (2015.01); *H04B 17/103* (2015.01); *H04B 17/104* (2015.01); *H04B 17/15* (2015.01)

(58) Field of Classification Search
CPC ........ H04B 17/15; H04B 17/104; H04B 3/48; H04B 17/102; H04B 17/103; H04B 3/46; G01R 35/005
See application file for complete search history.

(56) References Cited

U.S. PATENT DOCUMENTS

| | | | | |
|---|---|---|---|---|
| 6,060,888 A | * | 5/2000 | Blackham | G01R 27/28 324/601 |
| 2008/0036469 A1 | * | 2/2008 | Chladek | G01R 35/005 324/601 |
| 2014/0032190 A1 | * | 1/2014 | Shlepnev | G06F 17/5036 703/2 |

(Continued)

OTHER PUBLICATIONS

Gomez et al. "On-Wafer CMOS Transistors De0Embedding Technique Method using Two Transmission Lines of Different Lengths", 2012, pp. 417-420, 2012 IEEE Radio Frequency Integrated Circuits Symposium.*

(Continued)

*Primary Examiner* — Sophia Vlahos
(74) *Attorney, Agent, or Firm* — Barnes & Thornburg LLP

(57) ABSTRACT

Technologies for determining the parameters of a transmission line such as a printed circuit board trace and a cable are disclosed. By measuring a reflection coefficient and a transmission coefficient of two different electrical structures with the same type of fixture on each end and transmission lines of different lengths, the attenuation coefficient of the transmission lines can be determined. The attenuation coefficient can indicate whether or not the performance of the transmission line is acceptable or may be used to calibrate a measuring device for subsequent measurements.

25 Claims, 5 Drawing Sheets

(56) References Cited

U.S. PATENT DOCUMENTS

2015/0214965 A1* 7/2015 Odedara .................. H03L 7/07
327/158

OTHER PUBLICATIONS

Chen et al. "A Novel De-Embedding Method Suitable for Transmission-Line Measurement", Aug. 2015, pp. 1-4, APMEC.*
Fischer et al. "Easy de-embedding of symmetrical coax-to-microstrip transitions", 2008, pp. 1-4, IEEE SPI 2008.*
Zuniga-Juarez et al. "An improved two-tier L-L method for characterizing symmetrical microwave test fixtures", Jun. 2011, pp. 1491-1497, Measurement 44.*
Reynoso-Hernández, "Unified Method for Determining the Complex Propagation Constant of Reflecting and Nonreflecting Transmission Lines", Aug. 2003, pp. 351-353, IEEE Microwave and Wireless Components Letters, vol. 13, No. 8.*

"Intel Delta-L Methodology for Electrical Characterization," dated Feb. 2014, retrieved from http://www.intel.com/content/dam/www/public/us/en/documents/guides/delta-I-methodology-for-electrical-characterization-guide.pdf on Feb. 11, 2017 (25 pages).
Xiaoning Ye et al., "Accurate Characterization of PCB Transmission Lines for High Speed Interconnect," APEMC 2015 (4 page).
PNA-X Series Microwave Network Analyzers Product Brochure, Keysight Technologies, retrieved from http://literature.cdn.keysight.com/litweb/pdf/5990-4592EN.pdf?id=1900906-1-eng on Feb. 11, 2017 (41 pages).
Ching-Chao Huang, "In-Situ De-embedding (ISD)," dated Jan. 20, 2016, retrieved from http://ataitec.com/docs/In-Situ_De-embedding.pdf on Feb. 11, 2017 (42 pages).
Ching-Chao Huang, "In Situ De-embedding," AtaiTec Corporation white paper, undated, retrieved from http://www.ataitec.com/PDF/ISD_white_paper.pdf on Feb. 11, 2017 (4 pages).
TRL Calibration, dated Dec. 13, 2012, retrieved from http://na.support.keysight.com/pna/help/latest/S3_Cals/TRL_Calibration.htm on Feb. 11, 2017 (3 pages).

* cited by examiner

TECHNOLOGIES FOR PCB AND CABLE LOSS CHARACTERIZATION AND FIXTURE DE-EMBEDDING

CROSS-REFERENCE TO RELATED APPLICATIONS

The present application claims the benefit of U.S. Provisional Patent Application No. 62/327,671, filed Apr. 26, 2016.

BACKGROUND

Transmission lines such as those in printed circuit boards (PCBs) and cables are widely used in electronic devices. With the increase of input/output (I/O) speeds in devices such as compute devices, it can be critical to ensure that transmission lines meet the insertion loss requirement at the desired frequencies. However, it can be difficult to isolate the behavior of the transmission line itself, as opposed to the overall behavior of the transmission line along with the connector or fixture to which the transmission line is attached.

Removing the effect of a connector or fixture in measured data to determine the behavior of a device under test (such as a transmission line) is commonly referred to as de-embedding. Existing methods of de-embedding may require several specific calibration structures and/or a relatively large number of measurements.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
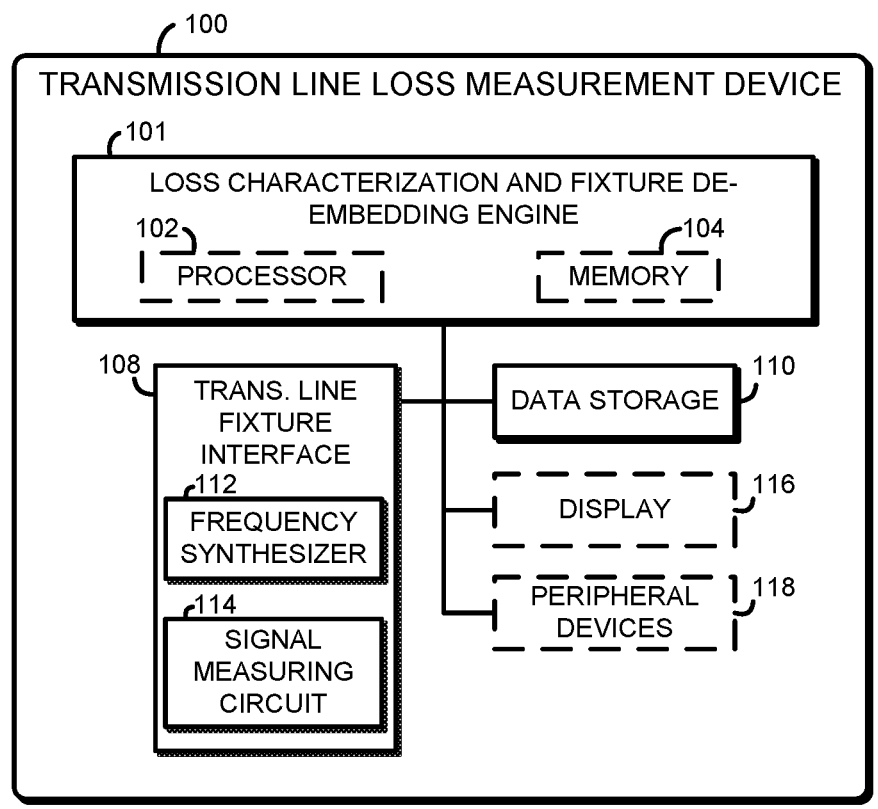
FIG. 1 is a simplified block diagram of at least one embodiment of a transmission line loss measurement device.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C): (A and B); (B and C); (A and C); or (A, B, and C). Similarly, items listed in the form of "at least one of A, B, or C" can mean (A); (B); (C): (A and B); (B and C); (A and C); or (A, B, and C).

The disclosed embodiments may be implemented, in some cases, in hardware, firmware, software, or any combination thereof. The disclosed embodiments may also be implemented as instructions carried by or stored on one or more transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Referring now to FIG. 1, an illustrative transmission line loss measurement device 100 is configured to determine an attenuation coefficient of a transmission line of an electrical structure. To do so, the transmission line loss measurement device 100 may be connected to an input fixture and an output fixture of an electrical structure being tested (e.g., see FIG. 2). The transmission line loss measurement device 100 sends a test signal at one or more frequencies to the input fixture and measures the output signal at each of the input fixture and the output fixture. The transmission line loss measurement device 100 is subsequently connected to another electrical structure (e.g., see FIG. 2) and the measurement is repeated. The four measured signals (the response at each of the input fixture and the output fixture for each electrical structure) are then used to determine the attenuation coefficient of the transmission lines of the electrical structures using a closed-form expression, as described in more detail below.

The transmission line loss measurement device 100 may be embodied as any type of device capable of performing the functions described herein. For example, the transmission line loss measurement device 100 may be embodied as or otherwise be included in, without limitation, a voltage meter, a network analyzer, a spectrum analyzer, an oscilloscope, an embedded computing system, a System-on-a-Chip (SoC), a desktop computer, a server computer, a tablet computer, a notebook computer, a laptop computer, a wearable computer, a smartphone, a cellular phone, a handset, a messaging device, a camera device, a multiprocessor system, a processor-based system, a consumer electronic device, and/or any other computing device. The illustrative transmission line loss measurement device 100 includes loss characterization and fixture de-embedding engine 101, a transmission line fixture interface 108, and a data storage 110. In some embodiments, one or more of the illustrative components of the transmission line loss measurement device 100 may be incorporated in, or otherwise form a portion of, another component. For example, the transmission line fixture interface 108, or portions thereof, may be incorporated in the line loss characterization and fixture de-embedding engine 101 in some embodiments.

The line loss characterization and fixture de-embedding engine 101 may be embodied as any electrical circuit capable of performing the function described herein. For example, the line loss characterization and fixture de-embedding engine 101 may be embodied as a processor 102 and a memory 104, a field programmable gate array (FPGA), an application specific integrated circuit (ASIC), etc. The processor 102 may be embodied as any type of processor capable of performing the functions described herein. For example, the processor 102 may be embodied as a single or multi-core processor(s), a single or multi-socket processor, a digital signal processor, a graphics processor, a microcontroller, or other processor or processing/controlling circuit. Similarly, the memory 104 may be embodied as any type of volatile or non-volatile memory or data storage capable of performing the functions described herein. In operation, the memory 104 may store various data and software used during operation of the transmission line loss measurement device 100 such as operating systems, applications, programs, libraries, and drivers. The memory 104 is communicatively coupled to the processor 102 via an I/O subsystem, which may be embodied as circuitry and/or components to facilitate input/output operations with the processor 102, the memory 104, and other components of the transmission line loss measurement device 100. For example, the I/O subsystem may be embodied as, or otherwise include, memory controller hubs, input/output control hubs, firmware devices, communication links (i.e., point-to-point links, bus links, wires, cables, light guides, printed circuit board traces, etc.) and/or other components and subsystems to facilitate the input/output operations. In some embodiments, the I/O subsystem may form a portion of a system-on-a-chip (SoC) and be incorporated, along with the processor 102, the memory 104, and other components of the transmission line loss measurement device 100 on a single integrated circuit chip.

The transmission line fixture interface 108 may be embodied as any type of device capable of generating a test signal, sending the test signal to the input fixture of the electrical structure being tested, and measuring the response to the test signal at the input fixture and the output fixture of the electrical structure. The transmission line fixture interface 108 includes the physical connectors and/or cables necessary to electrically interface with an electrical structure, such as one or more Bayonet Neil-Concelman (BNC) or SubMiniature version A (SMA) connectors and/or cables and one or more test probes. The illustrative transmission line fixture interface 108 includes a frequency synthesizer 112 and a signal measuring circuit 114. The frequency synthesizer 112 may be embodied as any type of circuit capable of generating one or more frequencies, such as a direct analog synthesizer, a direct digital synthesizer, or an indirect digital synthesizer. The frequency synthesizer 112 may include an LC circuit, a quartz crystal, a phase-lock loop, and/or the like. The frequency synthesizer 112 may be capable of generating an electrical signal at any suitable frequency, such as 100 megahertz (MHz) to 100 gigahertz (GHz) or any range contained therein. The signal measuring circuit 114 may be embodied as any circuit capable of measuring the signals at the input and output fixtures of the electrical structure, such as a voltage meter, a radio frequency (RF) power meter, a network analyzer, a spectrum analyzer, and/or the like. In the illustrative embodiment, the signal measuring circuit 114 is capable of measuring both the amplitude and phase of the measured signals.

The data storage 110 may be embodied as any type of device or devices configured for the short-term or long-term storage of data. For example, the data storage 110 may include any one or more memory devices and circuits, memory cards, hard disk drives, solid-state drives, or other data storage devices.

Of course, in some embodiments, the transmission line loss measurement device 100 may include other or additional components, such as those commonly found in a compute device. For example, the transmission line loss measurement device 100 may also have a display 116 and/or peripheral devices 118 such as buttons, a keyboard, a mouse, etc.

The display 116 may be embodied as any type of display on which information may be displayed to a user of the transmission line loss measurement device 100, such as a liquid crystal display (LCD), a light emitting diode (LED) display, a cathode ray tube (CRT) display, a plasma display, an image projector (e.g., 2D or 3D), a laser projector, a touchscreen display, a heads-up display, and/or other display technology.

Figure 2:
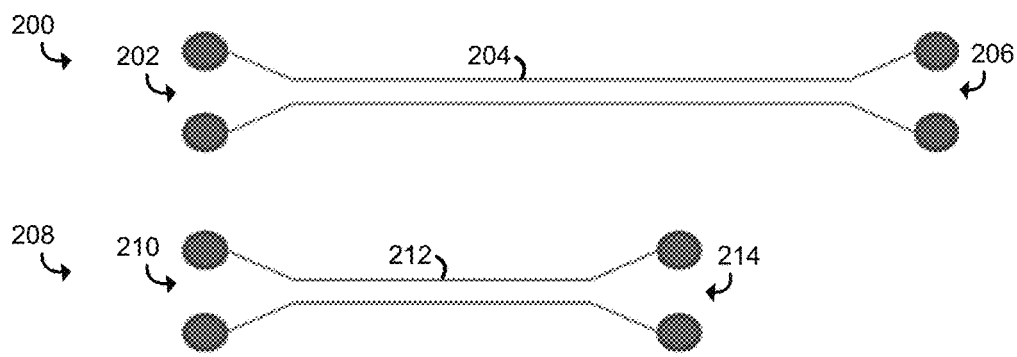
FIG. 2 is a simplified diagram of at least one embodiment of two electrical structures to be tested.

Referring now to FIG. 2, an illustrative long electrical structure 200 to be tested includes an input fixture 202, a transmission line 204, and an output fixture 206. FIG. 2 also shows an illustrative short electrical structure 208 to be tested, which includes an input fixture 210, a transmission line 212, and an output fixture 214. As the name of the short electrical structure 208 implies, it is shorter than the long electrical structure 200. In the illustrative embodiment, the length of the long transmission line 204 is less than or equal to twice the length of the short transmission line 212. Each input and output fixture 202, 206, 210, and 214 may be any suitable type of fixture for coupling an electrical signal, such as an SMA surface mount connector, an SMA cable connector, a BNC surface mount connector, a BNC cable connector, a test point on a printed circuit board, etc. The transmission line 204 may be any type of transmission line, such as a microstrip, a waveguide, a coaxial cable, a twisted pair cable, etc.

Figure 3:
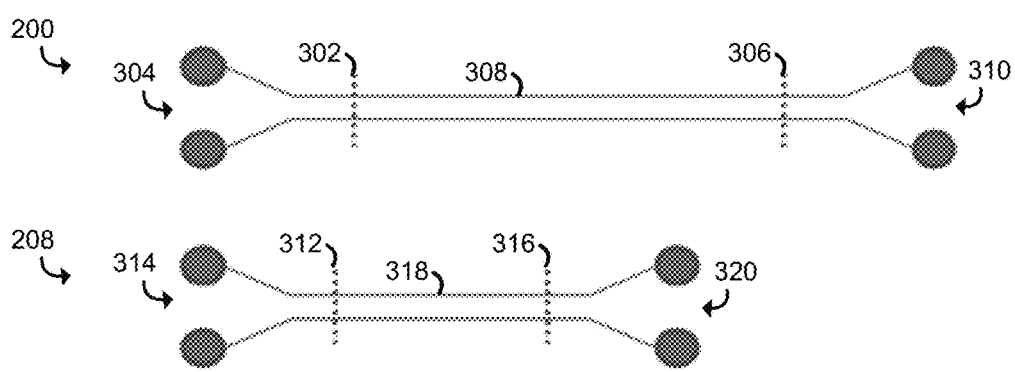
FIG. 3 is a simplified diagram of at least one embodiment of two electrical structures to be tested.

Referring now to FIG. 3, the illustrative long electrical structure 200 is shown with the elements grouped in a specific manner. The input fixture 202 and a portion of the transmission line 204 up to the dashed line 302 may be grouped together as an input fixture region 304, the portion of the transmission line 204 from the dashed line 302 to the dashed line 306 are grouped together as a transmission line test portion 308, and the output fixture 206 and a portion of the transmission line 204 after the dashed line 306 may be grouped together as an output fixture region 310. Similarly, in regard to the short electrical structure 208, the input fixture 210 and a portion of the transmission line 212 up to the dashed line 312 may be grouped together as an input fixture region 314, the portion of the transmission line 212 from the dashed line 312 to the dashed line 316 are grouped together as a transmission line test portion 318, and the output fixture 214 and a portion of the transmission line 212 after the dashed line 316 may be grouped together as an output fixture region 320.

The length of each portion of the transmission line grouped with a fixture region may be the same. As such, each input and output fixture region 304, 310, 314, and 320 can be considered as identical or essentially identical components. In the illustrative embodiment, the length of the portion of the transmission lines grouped together with the fixtures may be chosen such that the transmission line test portion 308 is twice as long as the transmission line test portion 318. This will be possible if the length of the long transmission line 204 is less than or equal to twice the length of the short transmission line 212. Partitioning the electrical structures 200 and 208 in such a way allows for a derivation of the parameters of the system in closed form, as discussed in more details below. In other embodiments, this condition may not be satisfied. However, as explained in more detail below, application of the equations discussed below do not require the condition that the length of the long transmission line 204 is less than or equal to twice the length of the short transmission line 212.

It should be appreciated that the electrical structures shown in FIGS. 2 and 3 are not the only type of electrical structures that the transmission line loss measurement device 100 can be connected to. The transmission line loss measurement device 100 may be connected to any suitable electrical structure that can be described as a network with several ports, and may include features such as resistors, capacitors, inductors, filters, attenuators, terminators, connectors, etc., and may, in some embodiments, include active elements such as transistors, amplifiers, etc.

Figure 4:
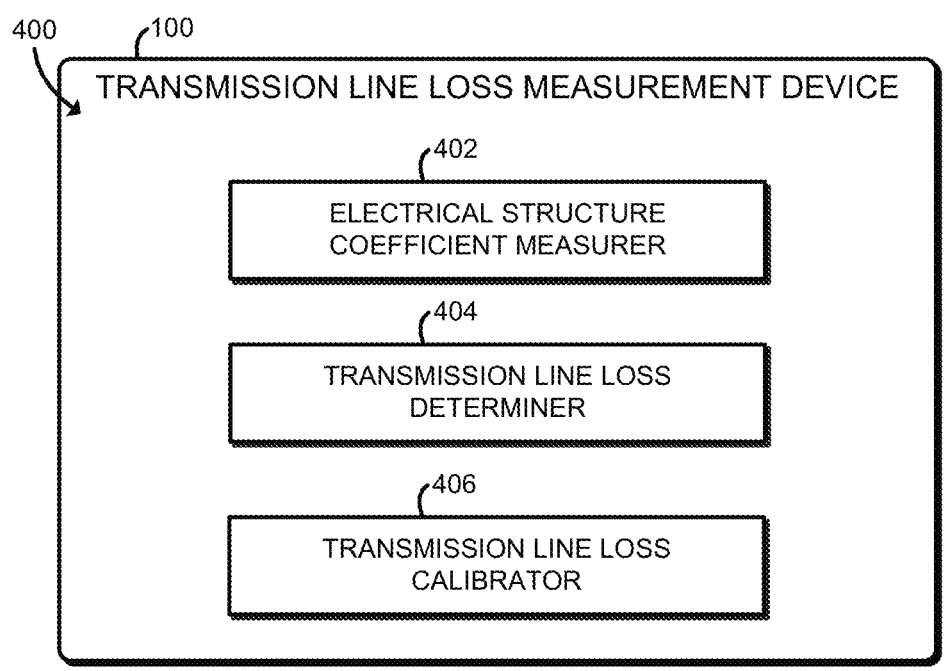
FIG. 4 is a simplified block diagram of at least one embodiment of an environment that may be established by the transmission line loss measurement device of FIG. 1.

Referring now to FIG. 4, in use, the transmission line loss measurement device 100 may include an environment 400, which may include hardware components, software components, firmware components, and/or a combination thereof. The illustrative environment 400 includes an electrical structure coefficient measurer 402, a transmission line loss determiner 404, and a transmission line loss calibrator 406. As stated above, in some embodiments, one or more of the components of the environment 400 may be embodied as circuitry or collection of electrical devices (e.g., an electrical structure coefficient measurer circuit 402, a transmission line loss determiner circuit 404, etc.). It should be appreciated that, in such embodiments the electrical structure coefficient measurer circuit 402, the transmission line loss determiner circuit 404, etc. may form a portion of one or more of the processor 102, the transmission line fixture interface 108, and/or other components of the transmission line loss measurement device 100. Additionally, in some embodiments, one or more of the illustrative components may form a portion of another component and/or one or more of the illustrative components may be independent of one another. Further, in some embodiments, one or more of the components of the environment 400 may be embodied as virtualized hardware components or emulated architecture, which may be established and maintained by the processor 102 or other components of the transmission line loss measurement device 100.

The electrical structure coefficient measurer 402 is configured to measure signals indicating the transmission and reflection of electromagnetic waves sent into an electrical structure (e.g., the two electrical structures shown in FIGS. 2 & 3). To do so, the electrical structure coefficient measurer 402 sends a test signal at one or more test frequencies to the input fixture of the electrical structure being tested, and measures an output signal from each of the input fixture and the output fixture of the electrical structure being tested. By measuring the transmitted signal and the reflected signal, the electrical structure coefficient measurer 402 can determine an indication of the transmission and reflection of the test signal. In some embodiments the indication of the transmission and reflection may be embodied as elements of a scattering matrix, or S-matrix. An S-matrix for a given frequency relates the input signals and output signals at that frequency of the ports of an electrical structure. The relationship is given by:

$$\begin{pmatrix} b_1 \\ b_2 \end{pmatrix} = \begin{pmatrix} S_{11} & S_{12} \\ S_{21} & S_{22} \end{pmatrix} \begin{pmatrix} a_1 \\ a_2 \end{pmatrix},$$

where $a_1$ is the input signal at the first port or fixture, $a_2$ is the input signal at the second port or fixture, $b_1$ is the output signal at the first port or fixture, $b_2$ is the output signal at the second port or fixture, $S_{11}$ is the reflection coefficient at the first port or fixture, $S_{22}$ is the reflection coefficient at the second port or fixture, $S_{12}$ is the transmission coefficient from the first port or fixture to the second, and $S_{21}$ is the transmission coefficient from the second port or fixture to the first. Generally, the input coefficients, output coefficients, and parameters of the S-matrix may be real, complex, or imaginary. The parameters of the S-matrix may be determined by any suitable measurement taken at the input and output fixtures. In the illustrative embodiment, the reflection coefficient $S_{11}$ is determined by dividing the output signal at the first fixture by the input signal at the first fixture (when there is no input signal provided at the second fixture). The reflection coefficient $S_{22}$ may be determined in a similar manner, but with an input signal provided at the second fixture instead of the first and using the corresponding input and output signals at the second fixture. In the illustrative embodiment, the transmission coefficient $S_{12}$ is determined by dividing the output signal at the second fixture by the input signal at the first fixture (when there is no input signal at the second fixture). The transmission coefficient $S_{21}$ may be determined in a similar manner by dividing the output signal at the first fixture by the input signal at the second fixture (when there is no input signal at the first fixture). In the illustrative embodiment, the first and second fixtures are assumed to have identical electrical properties and the overall structure is assumed to be symmetrical, so $S_{11}=S_{22}$ and $S_{12}=S_{21}$, so only some of the parameters (such as $S_{11}$ and $S_{12}$) may be measured. In some embodiments, the first and second fixtures may be different, so both $S_{11}$ and $S_{22}$ may be measured. Note that as long as each fixture is passive and reciprocal, then $S_{12}=S_{21}$ for the overall electrical structure, even if the input and output fixtures are different.

The transmission line loss determiner 404 is configured to determine the attenuation coefficient of the transmission lines of two electrical structures (e.g., the two electrical structures shown in FIGS. 2 & 3) based on the measured S-parameters at the frequency corresponding to the test frequency used. The reflection coefficient of the electrical structure 200 may be represented with $R_a$, the transmission coefficient of the electrical structure 200 may be represented with $T_a$, the reflection coefficient of the electrical structure 208 may be represented with $R_b$, the transmission coefficient of the electrical structure 208 may be represented with $T_b$. In order to determine parameters of the electrical structures, the transmission line loss determiner 404 applies an equation that can be derived using S-parameters.

Each of the input fixture regions 304 and 314 and output fixture regions 310 and 320 is treated as a lumped element as shown characterized by the same S-parameters, $S_{11}$, $S_{12}$, $S_{21}$, and $S_{22}$. Each element is assumed to be passive and reciprocal, so $S_{12}=S_{21}$. By symmetry $S_{11}=S_{22}$, since the input and output labels can be swapped without changing the physical system in any way. The transmission line test portions 308 and 318 are assumed to only attenuate the signal without any reflection, so each transmission line test portion 308 and 318 has reflection coefficients $S_{11}$ and $S_{22}$ that are zero and transmission coefficients of the form $e^{-\gamma x}$, where $\gamma$ is the propagation constant and x is the length of the transmission line. The propagation constant includes an attenuation coefficient $\alpha$ and a phase constant $\beta$, where $\gamma=\alpha+i\beta$. As noted above, the input and output fixture regions 304, 310, 314, and 320 are selected such that the length of the transmission line test portion 308 is twice as long as the transmission line test portion 318. The length of the transmission line test portion 308 may be represented by 2L and the length of the transmission line test portion 318 by L.

With the assumptions made above, there are four independent measured parameters from the electrical structure coefficient measurer 402 ($R_a$, $T_a$, $R_b$, and $T_b$) and four unknown parameters of the electrical structures ($S_{11}$, $S_{12}$, and $S_{22}$ for the input and output fixture regions 304, 310, 314, and 320 and the propagation constant $\gamma$ for the transmission lines test portions 308 and 318). The measured values can be related to the unknown parameters by determining the overall S-matrix for the electrical structures based on the S-matrices for the individual portions 304, 308, 310, 314, 18, and 320. To do so, the S-matrices of each portion 304, 308, 310, 314, 18, and 320 of each electrical structure 200 and 208 can be converted to scattering transfer matrices, which can then be multiplied together for each electrical structure 200 and 208 to form a scattering transfer matrix for each electrical structure 200 and 208, which can then be converted back into an S-matrix of each electrical structure. Setting each measured S-matrix equal to the S-matrix constructed using the parameters of the underlying components leads to the equations $$\begin{pmatrix} R_a & T_a \\ T_a & R_a \end{pmatrix} = \begin{pmatrix} S_{11} + \frac{S_{22}S_{12}^2 e^{-2\gamma L}}{1-S_{22}^2 e^{-2\gamma L}} & \frac{S_{12}^2 e^{-\gamma L}}{1-S_{22}^2 e^{-2\gamma L}} \\ \frac{S_{12}^2 e^{-\gamma L}}{1-S_{22}^2 e^{-2\gamma L}} & S_{11} + \frac{S_{11}S_{12}^2 e^{-2\gamma L}}{1-S_{22}^2 e^{-2\gamma L}} \end{pmatrix},$$

$$\begin{pmatrix} R_b & T_b \\ T_b & R_b \end{pmatrix} = \begin{pmatrix} S_{11} + \frac{S_{22}S_{12}^2 e^{-4\gamma L}}{1-S_{22}^2 e^{-4\gamma L}} & \frac{S_{12}^2 e^{-2\gamma L}}{1-S_{22}^2 e^{-4\gamma L}} \\ \frac{S_{12}^2 e^{-2\gamma L}}{1-S_{22}^2 e^{-4\gamma L}} & S_{11} + \frac{S_{22}S_{12}^2 e^{-4\gamma L}}{1-S_{22}^2 e^{-4\gamma L}} \end{pmatrix}.$$

The two matrix equations lead to four equations and four unknown parameters:

$$R_a = S_{11} + \frac{S_{22}S_{12}^2 e^{-2\gamma L}}{1-S_{22}^2 e^{-2\gamma L}},$$

$$T_a = \frac{S_{12}^2 e^{-\gamma L}}{1-S_{22}^2 e^{-2\gamma L}},$$

$$R_b = S_{11} + \frac{S_{22}S_{12}^2 e^{-4\gamma L}}{1-S_{22}^2 e^{-4\gamma L}},$$

-continued $$T_b = \frac{S_{12}^2 e^{-2\gamma L}}{1-S_{22}^2 e^{-4\gamma L}}.$$

Solving for the propagation constant $\gamma$ leads to the equation $$\gamma = -\frac{\ln\left(\frac{c \pm \sqrt{c^2-4}}{2}\right)}{L},$$

where c is defined by the formula $$c = \frac{(T_a^2 + T_b^2) - (R_a - R_b)^2}{T_a T_b}.$$

The attenuation coefficient $\alpha$ can be determined as the real part of the propagation constant $\gamma$, leading to $$\alpha = -\frac{\ln\left|\frac{c \pm \sqrt{c^2-4}}{2}\right|}{L}.$$

In the above equation, there are two possible values for $\alpha$, depending on the sign used for the term under the radical. It should be appreciated that, generally, only one sign will lead to a physical result (i.e., with $0 \leq \alpha \leq 1$). The transmission line loss determiner 404 applies the sign which leads to a physical result. In some embodiments, the phase constant $\beta$ may also be determined as the imaginary part of the propagation constant $\gamma$, leading to $$\beta = -\frac{\text{Arg}\left(\frac{c \pm \sqrt{c^2-4}}{2}\right)}{L},$$

where Arg( ) is the argument function, which gives the angle between the positive real axis and the line joining the input value to the origin. The sign applied for determining $\beta$ is the same as the sign applied for determining $\alpha$.

It should be appreciated that the term L in the formula refers to the length of the transmission line test portion 318, which is half of the length of the transmission line test portion 308. As a result, L is also the difference between the length of the transmission line test portion 308 and the transmission line test portion 318 and, therefore, the difference between the length of the transmission line 204 and the transmission line 212. In some embodiments, the transmission line loss determiner 404 may only access the difference between the lengths of the transmission lines 204 and 212, and may not have access to the lengths of the individual transmission lines 204 and 212.

In sum, the attenuation coefficient of the transmission line test portions 308 and 318 can be determined using a closed-form expression based on the measured parameters $R_a$, $T_a$, $R_b$, and $T_b$. It should be appreciated that, in some embodiments, the transmission line loss determiner 404 may also determine the remaining three unknown parameters in the four equations above, corresponding to the parameters of the input and output fixture regions 304, 310, 314, and 320 (i.e., $S_{12}$, $S_{11}$, and $S_{22}$). It should be appreciated that the contribution from the portion of the transmission lines 204 and 212 in the input and output fixture regions 304, 310, 314, and 320 can be factored out, leading to the parameters of the input and output fixtures 202, 206, 210, and 214 themselves. Of course, to do so, the transmission line loss determiner 404 may need to know the length of each transmission line 204 and 212, and not just the difference between them. In some embodiments, the transmission line loss determiner 404 may display the attenuation coefficient on the display 116 (or may display an indication of the attenuation coefficient, such as a loss per unit length).

It should be appreciated that the transmission line loss determiner 404 is not limited to exclusively use the equation derived above. In some embodiments, the transmission line loss determiner 404 may use an equivalent equation or use a different equation that relies on different assumptions based on the same general approach. For example, referring back to FIG. 2, a similar equation to that shown above can be derived by assuming that each input fixture 202 and 210 has the same S-matrix and that each output fixture 206 and 214 has the same S-matrix, but without the assumption that the S-matrix for the input fixtures 202 and 210 is the same as the S-matrix for the output fixtures 206 and 214. In order to determine the transmission line loss under such assumptions, additional measurements may be required, such as a reflection coefficient for a signal applied to into the output fixture 214 and 206 as well as the input fixture 202 and 210. Setting the two measured S-matrices for the two electrical structures 200 and 208 equal to the derived S-matrices based on the S-matrices of the different portions 304, 308, 310, 314, 18, and 320 of the electrical structures 200 and 208 leads to a set of six equations with seven unknowns. The number of unknowns can be reduced to six by combining the loss in the input fixture and output fixture for a given electrical structure into one term. The six remaining unknowns can then be solved in a closed form expression, including the attenuation coefficient for the transmission lines 204 and 212. In some embodiments, multiple redundant measurements may be made, and the parameters to be determined (such as the attenuation coefficient) may be determined by averaging the values associated with the various redundant measurements or with use of similar techniques to determine a likely value of the parameter to be determined.

The transmission line loss calibrator 406 is configured to calibrate the transmission line loss measurement device 100 based on the parameters determined by the transmission line loss determiner 404 by storing a calibration setting in the data storage 110. The calibration setting may be any value that is based on the measurements of the electrical structure coefficient measurer 402 and/or values calculated by the transmission line loss determiner 404. The calibration setting may be used to modify a measured value in any suitable manner. For example, the transmission line loss calibrator 406 may calibrate the transmission line loss measurement device 100 to remove the effect of the input and output fixtures of a measurement of a subsequent electrical structure under test.

Figure 5:
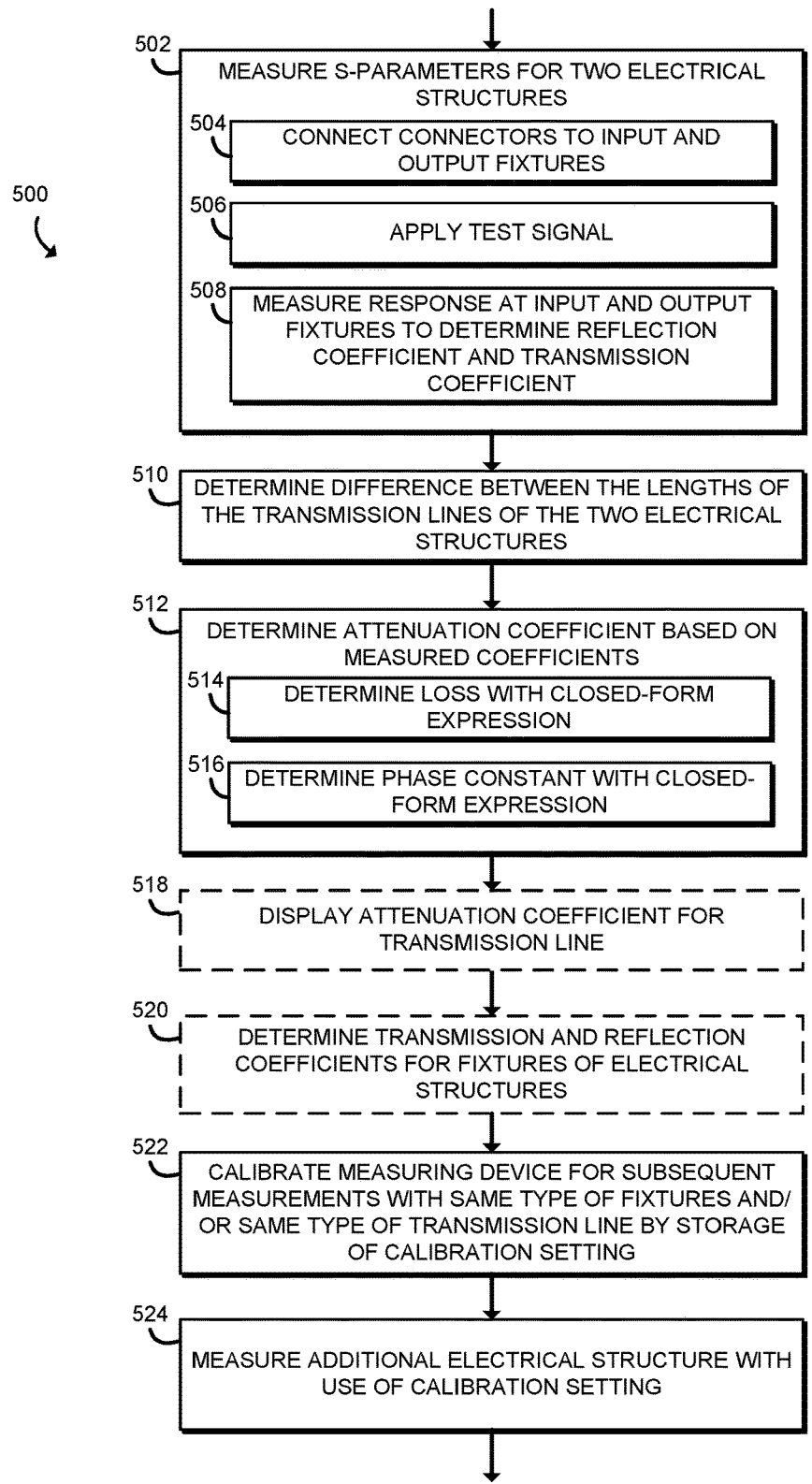
FIG. 5 is a simplified flow diagram of at least one embodiment of a method for characterizing the loss of a transmission line that may be executed by the transmission line loss measurement device of FIG. 1.

Referring now to FIG. 5, in use, the transmission line loss measurement device 100 may execute a method 500 for characterizing transmission line loss. The method 500 may represent the logic of the engine 101 (e.g., the logic of an ASIC, an FPGA, or software instructions executed by the processor 102). The method 500 may begin in block 502, in which the transmission line loss measurement device 100 may measure the S-parameters for each of two electrical structures. In order to measure the S-parameters, the transmission line loss measurement device 100 is connected through connectors (such as SMA, BNC, etc.) or a test probe to the input and output fixture of the electrical structure under test in block 504. In block 506, the transmission line loss measurement device 100 applies a test signal at a test frequency to the input fixture of the electrical structure under test. In block 508, the transmission line loss measurement device 100 measures the response at the input fixture of the electrical structure under test to determine the reflection coefficient $R_a$ or $R_b$ and the response at the output fixture of the electrical structure under test to determine the transmission coefficient $T_a$ or $T_b$.

In block 510, the transmission line loss measurement device 100 determines a difference between the lengths of the transmission lines of the two electrical structures. In the illustrative embodiment, the transmission line loss measurement device 100 may determine the difference by acquiring the lengths of the transmission lines, such as from an input from a user, an input from a separate compute device, or by retrieving the lengths of the transmission line from the data storage 110 and determine the difference between the lengths of the transmission lines. In other embodiments, the transmission line loss measurement device 100 may acquire the difference between the lengths of the transmission lines directly, such as from an input from a user, an input from a separate compute device, or by retrieving the difference between the lengths of the transmission line from the data storage 110.

In block 512, the transmission line loss measurement device 100 determines an attenuation coefficient based on the measured transmission and reflection coefficients and the difference between the lengths of the transmission lines. As discussed in more detail above, in the illustrative embodiment, the transmission line loss measurement device 100 determines the attenuation coefficient in block 514 by applying the closed-form expression $$\alpha = -\frac{\ln\left|\frac{c \pm \sqrt{c^2-4}}{2}\right|}{L}.$$

where $\alpha$ is the attenuation coefficient, L is the difference between the lengths of the transmission lines, and c is defined by the formula $$c = \frac{(T_a^2 + T_b^2) - (R_a - R_b)^2}{T_a T_b},$$

where $R_a$ is the reflection coefficient of the first electrical structure, $T_a$ is the transmission coefficient of the first electrical structure, $R_b$ is the reflection coefficient of the second electrical structure, and $T_b$ is the transmission coefficient of the second electrical structure. In some embodiments, the transmission line loss measuring device may also determine the phase constant $\beta$ in block 516 by applying the closed-form expression $$\beta = -\frac{\text{Arg}\left(\frac{c \pm \sqrt{c^2-4}}{2}\right)}{L},$$

where Arg( ) is the argument function, which give the angle between the positive real axis and the line joining the input value to the origin.

In block 518, in some embodiments, the transmission line loss measurement device 100 may display the attenuation coefficient on the display 116. In block 520, in some embodiments, the transmission line loss measurement device 100 may determine the transmission and reflection coefficients for the input and output fixtures of the electrical structures under test.

In block 522, the transmission line loss measurement device 100 may calibrate itself using the measurements and/or determined coefficients for a subsequent measurement of an electrical structure with the same type of transmission line and/or the same type of fixtures. To do so, the transmission line stores a calibration setting in the data storage 110 based on the measurements and/or determined coefficients.

In block 524, the transmission line loss measurement device 100 measures an additional electrical structure with use of the calibration setting. For example, the transmission line loss measurement device 100 may measure an electrical structure with input and output fixtures that are assumed to have the same S-matrix as those in the two test electrical structures, and factor out the effect of the input and output fixtures in order to determine parameters of the electrical structure to which they are connected.

Figure 6:
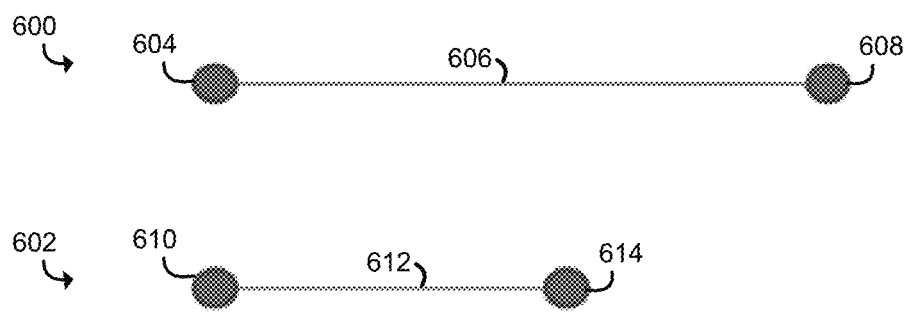
FIG. 6. is a simplified diagram of at least one embodiment of two electrical structures to be tested.

Referring now to FIG. 6, a long single-ended electrical structure 600 and a short single-ended electrical structure 602 are shown. It should be appreciated that all of the measurements and calculations discussed above, which may be applied to the differential mode of transmission lines of, e.g., electrical structures 200 and 208 apply equally to measurements and calculations of single-ended signaling, such as with single-ended electrical structures 600 and 602. Single-ended electrical structure 600 includes an input fixture 604, a wire 606, and an output fixture 608, and single-ended electrical structure 602 includes an input fixture 610, a wire 612, and an output fixture 614. Additionally, a ground plane or other grounding structure may be included as well, which is not shown in FIG. 6.

EXAMPLES

Illustrative examples of the devices, systems, and methods disclosed herein are provided below. An embodiment of the devices, systems, and methods may include any one or more, and any combination of, the examples described below.

Example 1 includes a transmission line loss measurement device comprising a transmission line fixture interface to apply a test signal to each of two electrical structures, wherein each of the two electrical structures comprises an input fixture, an output fixture, and a transmission line connecting the corresponding input fixture and the corresponding output fixture; and measure one or more parameters of an output signal from each of the two electrical structures, wherein the output signal is in response to applied test signal; an engine to determine a transmission coefficient and a reflection coefficient for each of the two electrical structures based on the corresponding one or more parameters; acquire a difference between the lengths of the transmission lines of the two electrical structures; and determine an attenuation coefficient associated with the transmission line of each of the two electrical structures based on the difference between the lengths of the transmission lines, the transmission coefficients, and the reflection coefficients of the two electrical structures.

Example 2 includes the subject matter of Example 1, and wherein to measure the one or more parameters of the output signal from each of the two electrical structures comprises to, for each of the two electrical structures measure one or more parameters of an input fixture output signal from the corresponding input fixture; measure one or more parameters of an output fixture output signal from the corresponding output fixture; determine the transmission coefficient based on the test signal and the one or more parameters of the output fixture output signal; and determine the reflection coefficient based on the test signal and the one or more parameters of the input fixture output signal.

Example 3 includes the subject matter of any of Examples 1 and 2, and wherein to measure the one or more parameters of the input fixture output signal from the corresponding input fixture comprises to measure an amplitude and a phase of the input fixture output signal, and wherein to measure the one or more parameters of the output fixture output signal from the corresponding output fixture comprises to measure an amplitude and a phase of the output fixture output signal.

Example 4 includes the subject matter of any of Examples 1-3, and wherein to determine the attenuation coefficient associated with the transmission line of each of the two electrical structures based on the difference between the lengths of the transmission lines, the transmission coefficients, and the reflection coefficients of the two electrical structures comprises to determine the attenuation coefficient associated with the transmission line of each of the two electrical structures based only on the difference between the lengths of the transmission lines, the transmission coefficients, and the reflection coefficients of the two electrical structures.

Example 5 includes the subject matter of any of Examples 1-4, and wherein to determine the attenuation coefficient associated with the transmission line of each of the two electrical structures based only on the difference between the lengths of the transmission lines, the transmission coefficients, and the reflection coefficients of the two electrical structures comprises to determine the attenuation coefficient by application of a closed-form equation of the form $\alpha=f(L, T_a, T_b, R_a, R_b)$, wherein $\alpha$ is the attenuation coefficient, L is the difference between the lengths of the transmission lines, $T_a$ is the transmission coefficient of the one of the two electrical structures, $R_a$ is the reflection coefficient of the one of the two electrical structures, $T_b$ is the transmission coefficient of the other of the two electrical structures, and $R_b$ is the reflection coefficient of the other of the two electrical structures.

Example 6 includes the subject matter of any of Examples 1-5, and wherein to determine the attenuation coefficient associated with the transmission line of each of the two electrical structures based only on the difference between the lengths of the transmission lines, the transmission coefficients, and the reflection coefficients of the two electrical structures comprises to determine the attenuation coefficient by application of a formula $$\alpha = -\frac{\ln\left|\frac{c \pm \sqrt{c^2-4}}{2}\right|}{L},$$

wherein α is the attenuation coefficient, L is the difference between the lengths of the transmission lines, and c is defined by a formula $$c = \frac{(T_a^2 + T_b^2) - (R_a - R_b)^2}{T_a T_b},$$

wherein $T_a$ is the transmission coefficient of the one of the two electrical structures, $R_a$ is the reflection coefficient of the one of the two electrical structures, $T_b$ is the transmission coefficient of the other of the two electrical structures, and $R_b$ is the reflection coefficient of the other of the two electrical structures.

Example 7 includes the subject matter of any of Examples 1-6, and further including a display, wherein the engine is further to display the attenuation coefficient on the display.

Example 8 includes the subject matter of any of Examples 1-7, and wherein the engine is further to determine a fixture transmission coefficient, a first fixture reflection coefficient, and a second fixture reflection coefficient based on the difference between the lengths of the transmission lines, the transmission coefficients, and the reflection coefficients of the two electrical structures.

Example 9 includes the subject matter of any of Examples 1-8, and wherein to apply a test signal to each of the two electrical structures comprises to apply a first test signal to each of the input fixtures of the two electrical structures; and apply a second test signal to each of the output fixtures of the two electrical structures, wherein to measure the one or more parameters of the output signal from each of the two electrical structures comprises to measure one or more first parameters of a first input fixture output signal from each of the two electrical structures, wherein the first input fixture output signal is in response to the first applied test signal; measure one or more first parameters of a first output fixture output signal from each of the two electrical structures, wherein the first output fixture output signal is in response to the first applied test signal; measure one or more second parameters of a second input fixture output signal from each of the two electrical structures, wherein the second input fixture output signal is in response to the second applied test signal; and measure one or more second parameters of a second output fixture output signal from each of the two electrical structures, wherein the second output fixture output signal is in response to the second applied test signal, wherein to determine the reflection coefficient for each of the two electrical structures comprises to determine the reflection coefficient based on the corresponding one or more first parameters of the first input fixture output signal, wherein the engine is further to determine a second reflection coefficient for each of the two electrical structures based on the corresponding one or more second parameters of the first output fixture output signal, wherein to determine the attenuation coefficient associated with the transmission line of each of the two electrical structures based on the difference between the lengths of the transmission lines, the transmission coefficients, and the reflection coefficients of the two electrical structures comprises to determine the attenuation coefficient associated with the transmission line of each of the two electrical structures based on the difference between the lengths of the transmission lines, the transmission coefficients, the reflection coefficients, and the second reflection coefficients of the two electrical structures.

Example 10 includes the subject matter of any of Examples 1-9, and further including a data storage, wherein the engine is further to determine a calibration setting based on the difference between the lengths of the transmission lines, the transmission coefficients, and the reflection coefficients of the two electrical structures; and store the calibration setting in the data storage.

Example 11 includes the subject matter of any of Examples 1-10, and wherein the engine is further to perform a measurement of an electrical property of an additional electrical structure to determine a value of the electrical property; and modify the value of the electrical property based on the stored calibration setting to determine a calibrated value of the electrical property.

Example 12 includes the subject matter of any of Examples 1-11, wherein the transmission lines connecting each input fixture to the corresponding output fixture is printed on a circuit board.

Example 13 includes the subject matter of any of Examples 1-12, wherein the transmission lines connecting each input fixture to the corresponding output fixture is a coaxial cable.

Example 14 includes a method for measuring transmission line loss with a transmission line loss measurement device, the method comprising applying, by the transmission line loss measurement device, a test signal to each of two electrical structures, wherein each of the two electrical structures comprises an input fixture, an output fixture, and a transmission line connecting the corresponding input fixture and the corresponding output fixture; measuring, by the transmission line loss measurement device, one or more parameters of an output signal from each of the two electrical structures, wherein the output signal is in response to applied test signal; determining, by the transmission line loss measurement device, a transmission coefficient and a reflection coefficient for each of the two electrical structures based on the corresponding one or more parameters; acquiring a difference between the lengths of the transmission lines of the two electrical structures; and determining an attenuation coefficient associated with the transmission line of each of the two electrical structures based on the difference between the lengths of the transmission lines, the transmission coefficients, and the reflection coefficients of the two electrical structures.

Example 15 includes the subject matter of Example 14, and wherein measuring the one or more parameters of the output signal from each of the two electrical structures comprises, for each of the two electrical structures measuring, by the transmission line loss measurement device, one or more parameters of an input fixture output signal from the corresponding input fixture; measuring, by the transmission line loss measurement device, one or more parameters of an output fixture output signal from the corresponding output fixture; determining the transmission coefficient based on the test signal and the one or more parameters of the output fixture output signal; and determining the reflection coefficient based on the test signal and the one or more parameters of the input fixture output signal.

Example 16 includes the subject matter of any of Examples 14 and 15, and wherein measuring the one or more parameters of the input fixture output signal from the corresponding input fixture comprises measuring an amplitude and a phase of the input fixture output signal, and wherein measuring the one or more parameters of the output fixture output signal from the corresponding output fixture comprises measuring an amplitude and a phase of the output fixture output signal.

Example 17 includes the subject matter of any of Examples 14-16, and wherein determining the attenuation coefficient associated with the transmission line of each of the two electrical structures based on the difference between the lengths of the transmission lines, the transmission coefficients, and the reflection coefficients of the two electrical structures comprises determining the attenuation coefficient associated with the transmission line of each of the two electrical structures based only on the difference between the lengths of the transmission lines, the transmission coefficients, and the reflection coefficients of the two electrical structures.

Example 18 includes the subject matter of any of Examples 14-17, and wherein determining the attenuation coefficient associated with the transmission line of each of the two electrical structures based only on the difference between the lengths of the transmission lines, the transmission coefficients, and the reflection coefficients of the two electrical structures comprises determining the attenuation coefficient by application of a closed-form equation of the form $\alpha = f(L, T_a, T_b, R_a, R_b)$, wherein $\alpha$ is the attenuation coefficient, L is the difference between the lengths of the transmission lines, $T_a$ is the transmission coefficient of the one of the two electrical structures, $R_a$ is the reflection coefficient of the one of the two electrical structures, $T_b$ is the transmission coefficient of the other of the two electrical structures, and $R_b$ is the reflection coefficient of the other of the two electrical structures.

Example 19 includes the subject matter of any of Examples 14-18, and wherein determining the attenuation coefficient associated with the transmission line of each of the two electrical structures based only on the difference between the lengths of the transmission lines, the transmission coefficients, and the reflection coefficients of the two electrical structures comprises determining the attenuation coefficient by application of a formula $$\alpha = -\frac{\ln\left|\frac{c \pm \sqrt{c^2 - 4}}{2}\right|}{L},$$

wherein $\alpha$ is the attenuation coefficient, L is the difference between the lengths of the transmission lines, and c is defined by a formula $$c = \frac{(T_a^2 + T_b^2) - (R_a - R_b)^2}{T_a T_b},$$

wherein $T_a$ is the transmission coefficient of the one of the two electrical structures, $R_a$ is the reflection coefficient of the one of the two electrical structures, $T_b$ is the transmission coefficient of the other of the two electrical structures, and $R_b$ is the reflection coefficient of the other of the two electrical structures.

Example 20 includes the subject matter of any of Examples 14-19, and further including displaying, by the transmission line loss measurement device, the attenuation coefficient on a display of the transmission line loss measurement device.

Example 21 includes the subject matter of any of Examples 14-20, and further including determining, by the transmission line loss measuring device, a fixture transmission coefficient, a first fixture reflection coefficient, and a second fixture reflection coefficient based on the difference between the lengths of the transmission lines, the transmission coefficients, and the reflection coefficients of the two electrical structures.

Example 22 includes the subject matter of any of Examples 14-21, and wherein applying a test signal to each of the two electrical structures comprises applying a first test signal to each of the input fixtures of the two electrical structures; and applying a second test signal to each of the output fixtures of the two electrical structures, wherein measuring the one or more parameters of the output signal from each of the two electrical structures comprises measuring one or more first parameters of a first input fixture output signal from each of the two electrical structures, wherein the first input fixture output signal is in response to the first applied test signal; measuring one or more first parameters of a first output fixture output signal from each of the two electrical structures, wherein the first output fixture output signal is in response to the first applied test signal; measuring one or more second parameters of a second input fixture output signal from each of the two electrical structures, wherein the second input fixture output signal is in response to the second applied test signal; and measuring one or more second parameters of a second output fixture output signal from each of the two electrical structures, wherein the second output fixture output signal is in response to the second applied test signal, wherein determining the reflection coefficient for each of the two electrical structures comprises determining the reflection coefficient based on the corresponding one or more first parameters of the first input fixture output signal, further comprising determining a second reflection coefficient for each of the two electrical structures based on the corresponding one or more second parameters of the first output fixture output signal, wherein determining the attenuation coefficient associated with the transmission line of each of the two electrical structures based on the difference between the lengths of the transmission lines, the transmission coefficients, and the reflection coefficients of the two electrical structures comprises determining the attenuation coefficient associated with the transmission line of each of the two electrical structures based on the difference between the lengths of the transmission lines, the transmission coefficients, the reflection coefficients, and the second reflection coefficients of the two electrical structures.

Example 23 includes the subject matter of any of Examples 14-22, and further including determining, by the transmission line loss measurement device, a calibration setting based on the difference between the lengths of the transmission lines, the transmission coefficients, and the reflection coefficients of the two electrical structures; and storing, by the transmission line loss measurement device, the calibration setting on a data storage of the transmission line loss measurement device.

Example 24 includes the subject matter of any of Examples 14-23, and further including performing, by the transmission line loss measurement device, a measurement of an electrical property of an additional electrical structure to determine a value of the electrical property; and modifying, by the transmission line loss measurement device, the value of the electrical property based on the stored calibration setting to determine a calibrated value of the electrical property.

Example 25 includes the subject matter of any of Examples 14-24, and wherein the transmission lines connecting each input fixture to the corresponding output fixture is printed on a circuit board.

Example 26 includes the subject matter of any of Examples 14-25, and wherein the transmission lines connecting each input fixture to the corresponding output fixture is a coaxial cable.

Example 27 includes one or more computer-readable media comprising a plurality of instructions stored thereon that, when executed, causes a transmission line loss measurement device to perform the method of any of Examples 15-26.

Example 28 includes a transmission line loss measurement device comprising means for applying, by the transmission line loss measurement device, a test signal to each of two electrical structures, wherein each of the two electrical structures comprises an input fixture, an output fixture, and a transmission line connecting the corresponding input fixture and the corresponding output fixture; means for measuring, by the transmission line loss measurement device, one or more parameters of an output signal from each of the two electrical structures, wherein the output signal is in response to applied test signal; means for determining, by the transmission line loss measurement device, a transmission coefficient and a reflection coefficient for each of the two electrical structures based on the corresponding one or more parameters; means for acquiring a difference between the lengths of the transmission lines of the two electrical structures; and means for determining an attenuation coefficient associated with the transmission line of each of the two electrical structures based on the difference between the lengths of the transmission lines, the transmission coefficients, and the reflection coefficients of the two electrical structures.

Example 29 includes the subject matter of Example 28, and wherein the means for measuring the one or more parameters of the output signal from each of the two electrical structures comprises, for each of the two electrical structures means for measuring one or more parameters of an input fixture output signal from the corresponding input fixture; means for measuring one or more parameters of an output fixture output signal from the corresponding output fixture; means for determining the transmission coefficient based on the test signal and the one or more parameters of the output fixture output signal; and means for determining the reflection coefficient based on the test signal and the one or more parameters of the input fixture output signal.

Example 30 includes the subject matter of any of Examples 28 and 29, and wherein the means for measuring the one or more parameters of the input fixture output signal from the corresponding input fixture comprises means for measuring an amplitude and a phase of the input fixture output signal, and wherein the means for measuring the one or more parameters of the output fixture output signal from the corresponding output fixture comprises means for measuring an amplitude and a phase of the output fixture output signal.

Example 31 includes the subject matter of any of Examples 28-30, and wherein the means for determining the attenuation coefficient associated with the transmission line of each of the two electrical structures based on the difference between the lengths of the transmission lines, the transmission coefficients, and the reflection coefficients of the two electrical structures comprises means for determining the attenuation coefficient associated with the transmission line of each of the two electrical structures based only on the difference between the lengths of the transmission lines, the transmission coefficients, and the reflection coefficients of the two electrical structures.

Example 32 includes the subject matter of any of Examples 28-31, and wherein the means for determining the attenuation coefficient associated with the transmission line of each of the two electrical structures based only on the difference between the lengths of the transmission lines, the transmission coefficients, and the reflection coefficients of the two electrical structures comprises means for determining the attenuation coefficient by application of a closed-form equation of the form $\alpha=f(L, T_a, T_b, R_a, R_b)$, wherein $\alpha$ is the attenuation coefficient, L is the difference between the lengths of the transmission lines, $T_a$ is the transmission coefficient of the one of the two electrical structures, $R_a$ is the reflection coefficient of the one of the two electrical structures, $T_b$ is the transmission coefficient of the other of the two electrical structures, and $R_b$ is the reflection coefficient of the other of the two electrical structures.

Example 33 includes the subject matter of any of Examples 28-32, and wherein the means for determining the attenuation coefficient associated with the transmission line of each of the two electrical structures based only on the difference between the lengths of the transmission lines, the transmission coefficients, and the reflection coefficients of the two electrical structures comprises means for determining the attenuation coefficient by application of a formula $$\alpha = -\frac{\ln\left|\frac{c \pm \sqrt{c^2-4}}{2}\right|}{L},$$

wherein $\alpha$ is the attenuation coefficient, L is the difference between the lengths of the transmission lines, and c is defined by a formula $$c = \frac{(T_a^2 + T_b^2) - (R_a - R_b)^2}{T_a T_b},$$

wherein $T_a$ is the transmission coefficient of the one of the two electrical structures, $R_a$ is the reflection coefficient of the one of the two electrical structures, $T_b$ is the transmission coefficient of the other of the two electrical structures, and $R_b$ is the reflection coefficient of the other of the two electrical.

Example 34 includes the subject matter of any of Examples 28-33, and further including a display; and means for displaying the attenuation coefficient on the display.

Example 35 includes the subject matter of any of Examples 28-34, and further including means for determining a fixture transmission coefficient, a first fixture reflection coefficient, and a second fixture reflection coefficient based on the difference between the lengths of the transmission lines, the transmission coefficients, and the reflection coefficients of the two electrical structures.

Example 36 includes the subject matter of any of Examples 28-35, and wherein the means for applying a test signal to each of the two electrical structures comprises means for applying a first test signal to each of the input fixtures of the two electrical structures; and means for applying a second test signal to each of the output fixtures of the two electrical structures, wherein the means for measuring the one or more parameters of the output signal from each of the two electrical structures comprises means for measuring one or more first parameters of a first input fixture output signal from each of the two electrical structures, wherein the first input fixture output signal is in response to the first applied test signal; means for measuring one or more first parameters of a first output fixture output signal from each of the two electrical structures, wherein the first output fixture output signal is in response to the first applied test signal; means for measuring one or more second parameters of a second input fixture output signal from each of the two electrical structures, wherein the second input fixture output signal is in response to the second applied test signal; and means for measuring one or more second parameters of a second output fixture output signal from each of the two electrical structures, wherein the second output fixture output signal is in response to the second applied test signal, wherein the means for determining the reflection coefficient for each of the two electrical structures comprises means for determining the reflection coefficient based on the corresponding one or more first parameters of the first input fixture output signal, further comprising means for determining a second reflection coefficient for each of the two electrical structures based on the corresponding one or more second parameters of the first output fixture output signal, wherein the means for determining the attenuation coefficient associated with the transmission line of each of the two electrical structures based on the difference between the lengths of the transmission lines, the transmission coefficients, and the reflection coefficients of the two electrical structures comprises means for determining the attenuation coefficient associated with the transmission line of each of the two electrical structures based on the difference between the lengths of the transmission lines, the transmission coefficients, the reflection coefficients, and the second reflection coefficients of the two electrical structures.

Example 37 includes the subject matter of any of Examples 28-36, and further including a data storage; means for determining a calibration setting based on the difference between the lengths of the transmission lines, the transmission coefficients, and the reflection coefficients of the two electrical structures; and means for storing the calibration setting in the data storage.

Example 38 includes the subject matter of any of Examples 28-37, and further including means for performing a measurement of an electrical property of an additional electrical structure to determine a value of the electrical property; and means for modifying the value of the electrical property based on the stored calibration setting to determine a calibrated value of the electrical property.

Example 39 includes the subject matter of any of Examples 28-38, and wherein the transmission lines connecting each input fixture to the corresponding output fixture is printed on a circuit board.

Example 40 includes the subject matter of any of Examples 28-39, and wherein the transmission lines connecting each input fixture to the corresponding output fixture is a coaxial cable.

The invention claimed is:

1. A transmission line loss measurement device comprising:
   a transmission line fixture interface to:
   apply a test signal to each of two electrical structures, wherein each of the two electrical structures comprises an input fixture, an output fixture, and a transmission line connecting the corresponding input fixture and the corresponding output fixture; and
   measure one or more parameters of an output signal from each of the two electrical structures, wherein the output signal is in response to the applied test signal;
   an engine to:
   determine a transmission coefficient and a reflection coefficient for each of the two electrical structures based on the corresponding one or more parameters;
   acquire a difference between the lengths of the transmission lines of the two electrical structures; and
   determine an attenuation coefficient associated with the transmission line of each of the two electrical structures based on the difference between the lengths of the transmission lines, the transmission coefficients, and the reflection coefficients of the two electrical structures.

2. The transmission line loss measurement device of claim 1, wherein to measure the one or more parameters of the output signal from each of the two electrical structures comprises to, for each of the two electrical structures:
   measure one or more parameters of an input fixture output signal from the corresponding input fixture;
   measure one or more parameters of an output fixture output signal from the corresponding output fixture;
   determine the transmission coefficient based on the test signal and the one or more parameters of the output fixture output signal; and
   determine the reflection coefficient based on the test signal and the one or more parameters of the input fixture output signal.

3. The transmission line loss measurement device of claim 2, wherein to measure the one or more parameters of the input fixture output signal from the corresponding input fixture comprises to measure an amplitude and a phase of the input fixture output signal, and
   wherein to measure the one or more parameters of the output fixture output signal from the corresponding output fixture comprises to measure an amplitude and a phase of the output fixture output signal.

4. The transmission line loss measurement device of claim 1, wherein to determine the attenuation coefficient associated with the transmission line of each of the two electrical structures based on the difference between the lengths of the transmission lines, the transmission coefficients, and the reflection coefficients of the two electrical structures comprises to determine the attenuation coefficient associated with the transmission line of each of the two electrical structures based only on the difference between the lengths of the transmission lines, the transmission coefficients, and the reflection coefficients of the two electrical structures.

5. The transmission line loss measurement device of claim 4, wherein to determine the attenuation coefficient associated with the transmission line of each of the two electrical structures based only on the difference between the lengths of the transmission lines, the transmission coefficients, and the reflection coefficients of the two electrical structures comprises to determine the attenuation coefficient by application of a closed-form equation of the form $$\alpha = f(L, T_a, T_b, R_a, R_b),$$

wherein $\alpha$ is the attenuation coefficient, L is the difference between the lengths of the transmission lines, $T_a$ is the transmission coefficient of the one of the two electrical structures, $R_a$ is the reflection coefficient of the one of the two electrical structures, $T_b$ is the transmission coefficient of the other of the two electrical structures, and $R_b$ is the reflection coefficient of the other of the two electrical structures.

6. The transmission line loss measurement device of claim 4, wherein to determine the attenuation coefficient associated with the transmission line of each of the two electrical structures based only on the difference between the lengths of the transmission lines, the transmission coefficients, and the reflection coefficients of the two electrical structures comprises to determine the attenuation coefficient by application of a formula $$\alpha = -\frac{\ln\left|\frac{c \pm \sqrt{c^2-4}}{2}\right|}{L},$$

wherein $\alpha$ is the attenuation coefficient, L is the difference between the lengths of the transmission lines, and c is defined by a formula $$c = \frac{(T_a^2 + T_b^2) - (R_a - R_b)^2}{T_a T_b},$$

wherein $T_a$ is the transmission coefficient of the one of the two electrical structures, $R_a$ is the reflection coefficient of the one of the two electrical structures, $T_b$ is the transmission coefficient of the other of the two electrical structures, and $R_b$ is the reflection coefficient of the other of the two electrical structures.

7. The transmission line loss measurement device of claim 1, wherein the engine is further to determine a fixture transmission coefficient, a first fixture reflection coefficient, and a second fixture reflection coefficient based on the difference between the lengths of the transmission lines, the transmission coefficients, and the reflection coefficients of the two electrical structures.

8. The transmission line loss measurement device of claim 1, wherein to apply a test signal to each of the two electrical structures comprises to:
apply a first test signal to each of the input fixtures of the two electrical structures; and
apply a second test signal to each of the output fixtures of the two electrical structures,
wherein to measure the one or more parameters of the output signal from each of the two electrical structures comprises to:
measure one or more first parameters of a first input fixture output signal from each of the two electrical structures, wherein the first input fixture output signal is in response to the first applied test signal;
measure one or more first parameters of a first output fixture output signal from each of the two electrical structures, wherein the first output fixture output signal is in response to the first applied test signal;
measure one or more second parameters of a second input fixture output signal from each of the two electrical structures, wherein the second input fixture output signal is in response to the second applied test signal; and
measure one or more second parameters of a second output fixture output signal from each of the two electrical structures, wherein the second output fixture output signal is in response to the second applied test signal,
wherein to determine the reflection coefficient for each of the two electrical structures comprises to determine the reflection coefficient based on the corresponding one or more first parameters of the first input fixture output signal,
wherein the engine is further to determine a second reflection coefficient for each of the two electrical structures based on the corresponding one or more second parameters of the first output fixture output signal,
wherein to determine the attenuation coefficient associated with the transmission line of each of the two electrical structures based on the difference between the lengths of the transmission lines, the transmission coefficients, and the reflection coefficients of the two electrical structures comprises to determine the attenuation coefficient associated with the transmission line of each of the two electrical structures based on the difference between the lengths of the transmission lines, the transmission coefficients, the reflection coefficients, and the second reflection coefficients of the two electrical structures.

9. A method for measuring transmission line loss with a transmission line loss measurement device, the method comprising:
applying, by the transmission line loss measurement device, a test signal to each of two electrical structures, wherein each of the two electrical structures comprises an input fixture, an output fixture, and a transmission line connecting the corresponding input fixture and the corresponding output fixture;
measuring, by the transmission line loss measurement device, one or more parameters of an output signal from each of the two electrical structures, wherein the output signal is in response to the applied test signal;
determining, by the transmission line loss measurement device, a transmission coefficient and a reflection coefficient for each of the two electrical structures based on the corresponding one or more parameters;
acquiring a difference between the lengths of the transmission lines of the two electrical structures; and
determining, by the transmission line loss measuring device, an attenuation coefficient associated with the transmission line of each of the two electrical structures, a fixture transmission coefficient, a first fixture reflection coefficient, and a second fixture reflection coefficient based on the difference between the lengths of the transmission lines, the transmission coefficients, and the reflection coefficients of the two electrical structures.

10. The method of claim 9, wherein measuring the one or more parameters of the output signal from each of the two electrical structures comprises, for each of the two electrical structures:
measuring, by the transmission line loss measurement device, one or more parameters of an input fixture output signal from the corresponding input fixture;
measuring, by the transmission line loss measurement device, one or more parameters of an output fixture output signal from the corresponding output fixture;
determining the transmission coefficient based on the test signal and the one or more parameters of the output fixture output signal; and
determining the reflection coefficient based on the test signal and the one or more parameters of the input fixture output signal.

11. The method of claim 9, wherein determining the attenuation coefficient associated with the transmission line of each of the two electrical structures based on the difference between the lengths of the transmission lines, the transmission coefficients, and the reflection coefficients of the two electrical structures comprises determining the attenuation coefficient associated with the transmission line of each of the two electrical structures based only on the difference between the lengths of the transmission lines, the transmission coefficients, and the reflection coefficients of the two electrical structures.

12. The method of claim 11, wherein determining the attenuation coefficient associated with the transmission line of each of the two electrical structures based only on the difference between the lengths of the transmission lines, the transmission coefficients, and the reflection coefficients of the two electrical structures comprises determining the attenuation coefficient by application of a closed-form equation of the form $$\alpha = f(L, T_a, T_b, R_a, R_b),$$

wherein $\alpha$ is the attenuation coefficient, L is the difference between the lengths of the transmission lines, $T_a$ is the transmission coefficient of the one of the two electrical structures, $R_a$ is the reflection coefficient of the one of the two electrical structures, $T_b$ is the transmission coefficient of the other of the two electrical structures, and $R_b$ is the reflection coefficient of the other of the two electrical structures.

13. The method of claim 11, wherein determining the attenuation coefficient associated with the transmission line of each of the two electrical structures based only on the difference between the lengths of the transmission lines, the transmission coefficients, and the reflection coefficients of the two electrical structures comprises determining the attenuation coefficient by application of a formula $$\alpha = -\frac{\ln\left|\frac{c \pm \sqrt{c^2 - 4}}{2}\right|}{L},$$

wherein $\alpha$ is the attenuation coefficient, L is the difference between the lengths of the transmission lines, and c is defined by a formula $$c = \frac{(T_a^2 + T_b^2) - (R_a - R_b)^2}{T_a T_b},$$

wherein $T_a$ is the transmission coefficient of the one of the two electrical structures, $R_a$ is the reflection coefficient of the one of the two electrical structures, $T_b$ is the transmission coefficient of the other of the two electrical structures, and $R_b$ is the reflection coefficient of the other of the two electrical structures.

14. The method of claim 9, wherein applying a test signal to each of the two electrical structures comprises:
applying a first test signal to each of the input fixtures of the two electrical structures; and
applying a second test signal to each of the output fixtures of the two electrical structures,
wherein measuring the one or more parameters of the output signal from each of the two electrical structures comprises:
measuring one or more first parameters of a first input fixture output signal from each of the two electrical structures, wherein the first input fixture output signal is in response to the first applied test signal;
measuring one or more first parameters of a first output fixture output signal from each of the two electrical structures, wherein the first output fixture output signal is in response to the first applied test signal;
measuring one or more second parameters of a second input fixture output signal from each of the two electrical structures, wherein the second input fixture output signal is in response to the second applied test signal; and
measuring one or more second parameters of a second output fixture output signal from each of the two electrical structures, wherein the second output fixture output signal is in response to the second applied test signal,
wherein determining the reflection coefficient for each of the two electrical structures comprises determining the reflection coefficient based on the corresponding one or more first parameters of the first input fixture output signal,
further comprising determining a second reflection coefficient for each of the two electrical structures based on the corresponding one or more second parameters of the first output fixture output signal,
wherein determining the attenuation coefficient associated with the transmission line of each of the two electrical structures based on the difference between the lengths of the transmission lines, the transmission coefficients, and the reflection coefficients of the two electrical structures comprises determining the attenuation coefficient associated with the transmission line of each of the two electrical structures based on the difference between the lengths of the transmission lines, the transmission coefficients, the reflection coefficients, and the second reflection coefficients of the two electrical structures.

15. One or more non-transitory computer-readable media comprising a plurality of instructions stored thereon that, when executed, causes a compute device to:
apply a test signal to each of two electrical structures, wherein each of the two electrical structures comprises an input fixture, an output fixture, and a transmission line connecting the corresponding input fixture and the corresponding output fixture;
measure one or more parameters of an output signal from each of the two electrical structures, wherein the output signal is in response to the applied test signal;
determine a transmission coefficient and a reflection coefficient for each of the two electrical structures based on the corresponding one or more parameters;
acquire a difference between the lengths of the transmission lines of the two electrical structures; and
determine an attenuation coefficient associated with the transmission line of each of the two electrical structures, a fixture transmission coefficient, a first fixture reflection coefficient, and a second fixture reflection coefficient based on the difference between the lengths of the transmission lines, the transmission coefficients, and the reflection coefficients of the two electrical structures.

16. The one or more non-transitory computer-readable media of claim 15, wherein to measure the one or more parameters of the output signal from each of the two electrical structures comprises to, for each of the two electrical structures:
measure one or more parameters of an input fixture output signal from the corresponding input fixture;
measure one or more parameters of an output fixture output signal from the corresponding output fixture;
determine the transmission coefficient based on the test signal and the one or more parameters of the output fixture output signal; and determine the reflection coefficient based on the test signal and the one or more parameters of the input fixture output signal.

17. The one or more non-transitory computer-readable media of claim 15, wherein to determine the attenuation coefficient associated with the transmission line of each of the two electrical structures based on the difference between the lengths of the transmission lines, the transmission coefficients, and the reflection coefficients of the two electrical structures comprises to determine the attenuation coefficient associated with the transmission line of each of the two electrical structures based only on the difference between the lengths of the transmission lines, the transmission coefficients, and the reflection coefficients of the two electrical structures.

18. The one or more non-transitory computer-readable media of claim 17, wherein to determine the attenuation coefficient associated with the transmission line of each of the two electrical structures based only on the difference between the lengths of the transmission lines, the transmission coefficients, and the reflection coefficients of the two electrical structures comprises to determine the attenuation coefficient by application of a closed-form equation of the form $$\alpha = f(L, T_a, T_b, R_a, R_b),$$

wherein $\alpha$ is the attenuation coefficient, L is the difference between the lengths of the transmission lines, $T_a$ is the transmission coefficient of the one of the two electrical structures, $R_a$ is the reflection coefficient of the one of the two electrical structures, $T_b$ is the transmission coefficient of the other of the two electrical structures, and $R_b$ is the reflection coefficient of the other of the two electrical structures.

19. The one or more non-transitory computer-readable media of claim 17, wherein to determine the attenuation coefficient associated with the transmission line of each of the two electrical structures based only on the difference between the lengths of the transmission lines, the transmission coefficients, and the reflection coefficients of the two electrical structures comprises to determine the attenuation coefficient by application of a formula $$\alpha = -\frac{\ln\left|\frac{c \pm \sqrt{c^2-4}}{2}\right|}{L},$$

wherein $\alpha$ is the attenuation coefficient, L is the difference between the lengths of the transmission lines, and c is defined by a formula $$c = \frac{(T_a^2 + T_b^2) - (R_a - R_b)^2}{T_a T_b},$$

wherein $T_a$ is the transmission coefficient of the one of the two electrical structures, $R_a$ is the reflection coefficient of the one of the two electrical structures, $T_b$ is the transmission coefficient of the other of the two electrical structures, and $R_b$ is the reflection coefficient of the other of the two electrical structures.

20. The one or more non-transitory computer-readable media of claim 15, wherein to apply a test signal to each of the two electrical structures comprises to:

apply a first test signal to each of the input fixtures of the two electrical structures; and
apply a second test signal to each of the output fixtures of the two electrical structures,
wherein to measure the one or more parameters of the output signal from each of the two electrical structures comprises to:
    measure one or more first parameters of a first input fixture output signal from each of the two electrical structures, wherein the first input fixture output signal is in response to the first applied test signal;
    measure one or more first parameters of a first output fixture output signal from each of the two electrical structures, wherein the first output fixture output signal is in response to the first applied test signal;
    measure one or more second parameters of a second input fixture output signal from each of the two electrical structures, wherein the second input fixture output signal is in response to the second applied test signal; and
    measure one or more second parameters of a second output fixture output signal from each of the two electrical structures, wherein the second output fixture output signal is in response to the second applied test signal,
wherein to determine the reflection coefficient for each of the two electrical structures comprises to determine the reflection coefficient based on the corresponding one or more first parameters of the first input fixture output signal,
wherein the plurality of instructions further cause the compute device to determine a second reflection coefficient for each of the two electrical structures based on the corresponding one or more second parameters of the first output fixture output signal,
wherein to determine the attenuation coefficient associated with the transmission line of each of the two electrical structures based on the difference between the lengths of the transmission lines, the transmission coefficients, and the reflection coefficients of the two electrical structures comprises to determine the attenuation coefficient associated with the transmission line of each of the two electrical structures based on the difference between the lengths of the transmission lines, the transmission coefficients, the reflection coefficients, and the second reflection coefficients of the two electrical structures.

21. A transmission line loss measurement device comprising:

means for applying a test signal to each of two electrical structures, wherein each of the two electrical structures comprises an input fixture, an output fixture, and a transmission line connecting the corresponding input fixture and the corresponding output fixture;
means for measuring one or more parameters of an output signal from each of the two electrical structures, wherein the output signal is in response to the applied test signal;
means for determining a transmission coefficient and a reflection coefficient for each of the two electrical structures based on the corresponding one or more parameters;
means for acquiring a difference between the lengths of the transmission lines of the two electrical structures; and
means for determining an attenuation coefficient associated with the transmission line of each of the two electrical structures based on the difference between the lengths of the transmission lines, the transmission coefficients, and the reflection coefficients of the two electrical structures.

22. The transmission line loss measurement device of claim 21, wherein the means for determining the attenuation coefficient associated with the transmission line of each of the two electrical structures based on the difference between the lengths of the transmission lines, the transmission coefficients, and the reflection coefficients of the two electrical structures comprises means for determining the attenuation coefficient associated with the transmission line of each of the two electrical structures based only on the difference between the lengths of the transmission lines, the transmission coefficients, and the reflection coefficients of the two electrical structures.

23. The transmission line loss measurement device of claim 22, wherein the means for determining the attenuation coefficient associated with the transmission line of each of the two electrical structures based only on the difference between the lengths of the transmission lines, the transmission coefficients, and the reflection coefficients of the two electrical structures comprises means for determining the attenuation coefficient by application of a closed-form equation of the form $$\alpha = f(L, T_a, T_b, R_a, R_b),$$

wherein $\alpha$ is the attenuation coefficient, L is the difference between the lengths of the transmission lines, $T_a$ is the transmission coefficient of the one of the two electrical structures, $R_a$ is the reflection coefficient of the one of the two electrical structures, $T_b$ is the transmission coefficient of the other of the two electrical structures, and $R_b$ is the reflection coefficient of the other of the two electrical structures.

24. The transmission line loss measurement device of claim 1, further comprising a display, wherein the engine is further to display the attenuation coefficient on the display.

25. The transmission line loss measurement device of claim 1, wherein the transmission lines connecting each input fixture to the corresponding output fixture is printed on a circuit board.

* * * * *